United States Patent [19]

Ohtsuka et al.

[11] Patent Number: 5,342,713
[45] Date of Patent: Aug. 30, 1994

[54] PHASE SHIFTING MASK

[75] Inventors: Hiroshi Ohtsuka; Kazutoshi Abe, both of Tokyo; Takashi Taguchi, Kurokawa, all of Japan

[73] Assignee: Oki Electric Industry Co., Ltd., Tokyo, Japan

[21] Appl. No.: 949,824

[22] PCT Filed: Jun. 19, 1991

[86] PCT No.: PCT/JP91/00817
§ 371 Date: Dec. 18, 1992
§ 102(e) Date: Dec. 18, 1992

[87] PCT Pub. No.: WO91/20018
PCT Pub. Date: Dec. 26, 1991

[30] Foreign Application Priority Data

Jun. 21, 1990 [JP] Japan .................................. 2-161239

[51] Int. Cl.$^5$ .............................................. G03F 9/00
[52] U.S. Cl. .......................................... 430/5; 430/324
[58] Field of Search .................. 430/5, 22, 269, 322, 430/324, 396

[56] References Cited

U.S. PATENT DOCUMENTS 4,360,586 11/1982 Flanders et al. .................... 430/321
4,890,309 12/1989 Smith et al. ........................... 378/35

FOREIGN PATENT DOCUMENTS 62-59296 12/1987 Japan .
1-147458 6/1989 Japan .
2-34854A 2/1990 Japan .

OTHER PUBLICATIONS

M. Levenson et al, "Improving Resolution in Photolithography with a Phase-Shifting Mask", *IEEE Transactions on Electron Devices*, vol. ED-29, No. 12, Dec. 1982, pp. 1828–1836.

*Primary Examiner*—Steve Rosasco
*Attorney, Agent, or Firm*—Spencer, Frank & Schneider

[57] ABSTRACT

The present invention relates to a phase shifting mask for use in a photolithographic process of forming a wiring pattern. The phase shifting mask comprises a transparent base plate (11), shading layers (12) formed selectively on the transparent base plate (11), and two kinds of phase shifting layers (13a, 13b) formed on transparent portions of the transparent base plate between the adjacent shading layers, respectively. The phase difference of the two kinds of phase shifting layers (13a, 13b) relative to the transparent base plate (11) is 90°, and the phase difference between the phase shifting layers is 180°. The transfer of an unnecessary pattern in the shifter edge portion can be obviated by using the shading layers having a phase difference of 90° relative to the transparent base plate.

14 Claims, 4 Drawing Sheets

PHASE SHIFTING MASK

TECHNICAL FIELD

The present invention relates to a phase shifting mask for use in a photolithographic process of forming wiring patterns.

BACKGROUND ART

A phase shifting mask for inverting the phase of light disclosed in "IEEE TRANSACTIONS ON ELECTRON DEVICES, VOLUME ED-29, [NUMBER 12], (December 1982), published in the U.S.A., Page 1828-1836" will be described prior to the description of the present invention.

The construction and characteristics of this known phase shifting mask are shown in FIGS. 5(A) to 5(D). FIG. 5(A) is a sectional view of the phase shifting mask, FIG. 5(B) is a diagram of the amplitude of light on the phase shifting mask, FIG. 5(C) is a diagram of the amplitude of light on a wafer, not shown, and FIG. 5(D) is a diagram of the amplitude of light intensity on a wafer, not shown.

The phase shifting mask comprises a transparent glass base plate 1, shading layers 2 of chromium (Cr) or chromium dioxide ($CrO_2$) formed selectively in areas on one of the major surfaces of the base plate 1 in a predetermined pattern, and a phase shifting layer 3 formed over every other transparent area between the adjacent shading layers 2 on the same surface.

The phase shifting layer 3 is a single-layer light-transmissive film of an exposed photoresist, $SiO_2$ SOG or $MgF_2$, having a thickness d meeting an expression: $d = \lambda/\{2(n-1)\}$, where $\lambda$ is the wavelength of light projected on the phase shifting mask and n is the refractive index of phase shifting layer 3.

When a wafer, not shown, is irradiated through the phase shifting mask with light 4 of the wavelength $\lambda$, the amplitude of light passed through the phase shifting layer 3 appears on the lower side thereof as shown in FIG. 5(B). That is, the difference between the light passed through the phase shifting layer 3 and the light passed through a transparent section is 180° and consequently the amplitude of the light appears on the wafer as shown in FIG. 5(C) and the light intensity on the wafer is enhanced as shown in FIG. 5(D).

Thus, the light intensity on the wafer is enhanced when the phase shifting layer 3 is formed on every other transparent section of the phase shifting mask having a cyclic pattern as shown in FIG. 5(A) and thereby the contrast of an image formed on the wafer can be improved.

The functions of the phase shifting mask will be described hereinafter with reference to FIGS. 6, 7(A) and 7(B).

FIG. 6 shows a cyclic phase shifting pattern consisting of shading section, i.e., line sections (sections shaded with dots) and transparent sections, i.e., spacing sections (portions of the transparent plate with a phase of 0°). Shifting layers 3 having a phase difference of 180° relative to the transparent plate are formed alternately in the spacing sections.

FIGS. 7(A) and 7(B) shows the distribution of light intensity on a wafer, not shown, when the wafer is irradiated through the phase shift mask. In FIG. 7(A), curves a and b indicate the distribution of light intensity in a portion of the wafer corresponding to a central portion Y2-Y2' of the phase shifting pattern of FIG. 6 and the distribution of light intensity in a portion of the wafer corresponding to an edge portions Y1-Y1' of the phase shifting pattern, respectively.

In FIG. 7(B), a curve c indicates the distribution of maximum light intensity in a portion of the wafer corresponding to a phase shifting portion X1-X1' of the phase shifting pattern.

As is obvious from FIGS. 7(A) and 7(B), light intensity $I_2$ at a point A on the boundary between the phase shifter and a transparent section, i.e., a shifter edge portion, is lower than light intensity $I_1$ at a point B in the central portion B of the phase shifter.

SUMMARY OF THE INVENTION

A phase shifting mask according to the present invention comprises a transparent base member, shading layers formed in a pattern selectively on the base member, two kinds of phase shifting layer of a phase difference of 180°, formed in an alternate arrangement between the adjacent shading layers on the base member, respectively, and each having a phase difference of 90° relative to the base member.

BEST MODE FOR CARRYING OUT THE INVENTION

The present invention will be described hereinafter with reference to FIGS. 1 to 3.

Figure 1:
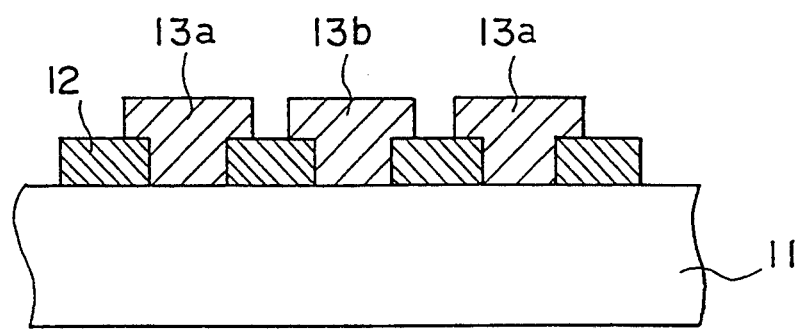
FIG. 1 is a sectional view of a phase shifting mask of the present invention.

FIG. 1 is a sectional view of a phase shifting mask of the present invention. In FIG. 1, there are shown a transparent base plate 11, shading layers 12, phase shifting layers 13a having a phase difference of 90° relative to the transparent base plate 11, and a phase shifting layers 13b having a phase difference of 270° relative to the transparent base plate 11. The phase shifting layers 13b are equivalent to having a phase difference of 90° relative to the transparent base plate 11.

These phase shifting patterns will be described hereinafter.

Figure 2:
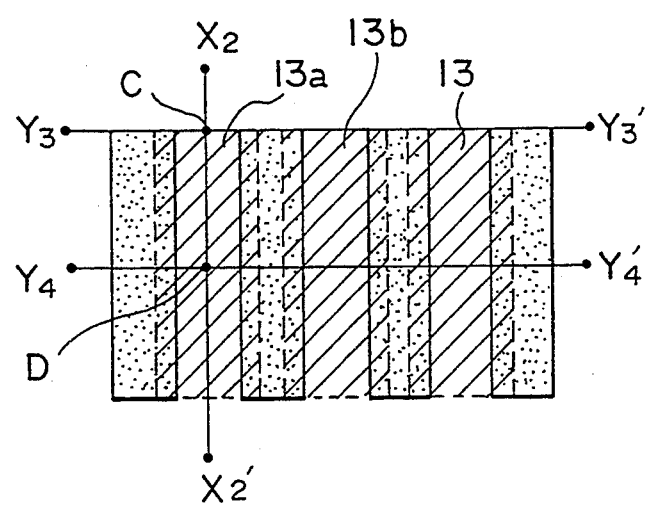
FIG. 2 is a top plan view of a phase shifting mask of the present invention.

FIG. 2 is a top plan view of the phase shifting mask, showing a shift pattern. Referring to FIG. 2, the phase shifting mask has a cyclic pattern of line portions (portions shaded with shading layers) as shading sections, and spacing portions as transmission sections. Phase shifting layers 13a (phase=90°) and phase shifting layers 13b (phase=270°) are arranged alternately on the spacing portions (portions of the transparent base plate having a phase of 0°). The phase difference between the two kinds of phase shifting layers is 180°.

Figure 3A:
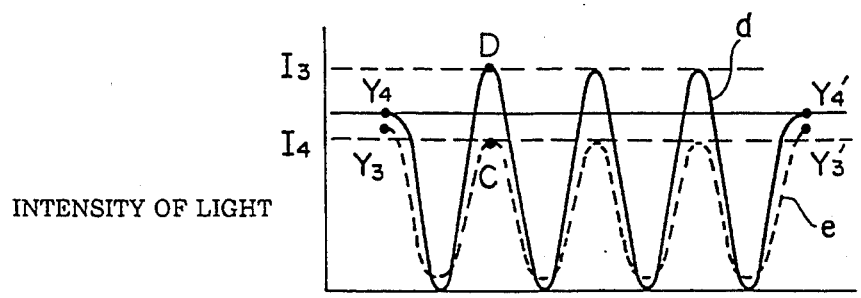
FIG. 3(A) is a diagram showing the distribution of light intensity on a wafer when a phase shifting mask of the present invention is used.

In FIG. 3(A), curves d and e indicate the distribution of light intensity in the central portion Y4-Y4' and the distribution of light intensity in the edge portion Y3-Y3', respectively, on a wafer, not shown, when the wafer is irradiated through the phase shifting mask with light of wavelength λ.

Figure 3B:
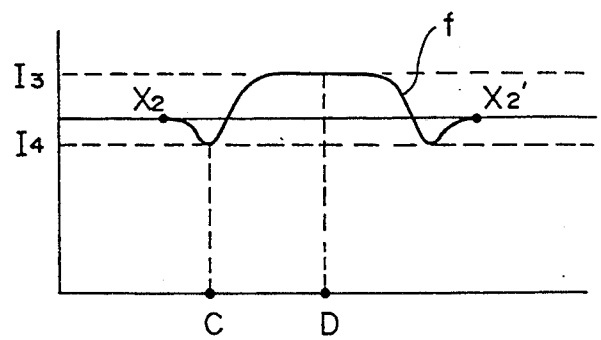
FIG. 3(B) is a diagram showing the distribution of light intensity on a wafer when a phase shifting mask of the present invention is used.

In FIG. 3(B), a curve f' indicates the variation of maximum light intensity on the wafer along a line X2-X2' on the phase shifting layer 13a. Pattern intervals are determined so that the contrast on the wafer is 1.0. At that time, as indicated by curve e in FIG. 3(A), the light intensity $I_4$ at a boundary point C (at the shifter edge portion) between the phase shifting layer 13a and the transmission section adjacent to the phase shifting layer 13a relative to the light intensity $I_3$ at the middle point D of the phase shifting layer 13a is on the order of 60%. That is, the light intensity at the boundary point C can be maintained at 0.9 or above in normalized value while the light intensity at the middle point D of the phase shifting layer 13a is maintained on a high level as indicated by a curve g in FIG. 3(C).

Figure 3C:
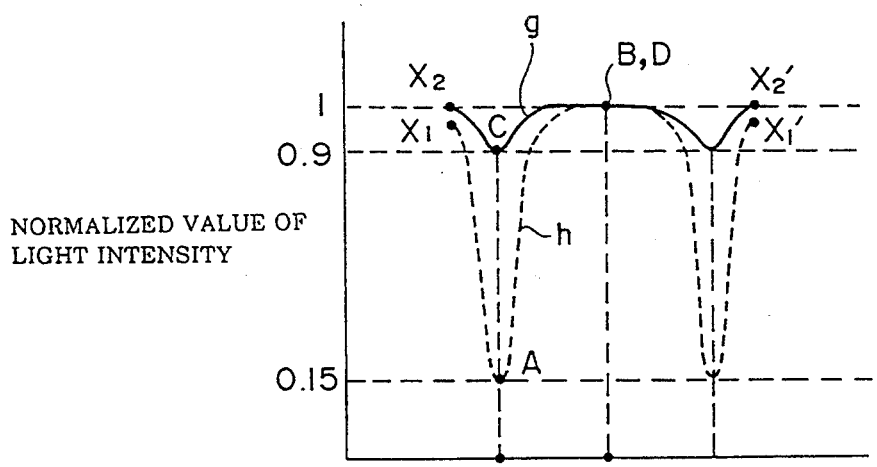
FIG. 3(C) is a diagram showing the distribution of light intensity contrast on a wafer when a phase shifting mask of the present invention is used.

In FIG. 3(C), a curve h indicates the distribution of light intensity when the phase shifting layers having a phase difference of 180° relative to the transparent base plate 11 are arranged on alternate shading sections. As is obvious from the comparative observation of the curve h with the curve g, the resolution in the shifter edge portions is improved by the phase shifting mask of the present invention.

Figure 4:
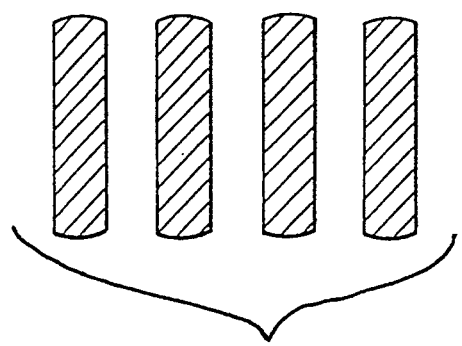
FIG. 4 is a diagrammatic view for the evaluation of a resist pattern.
Figure 5:
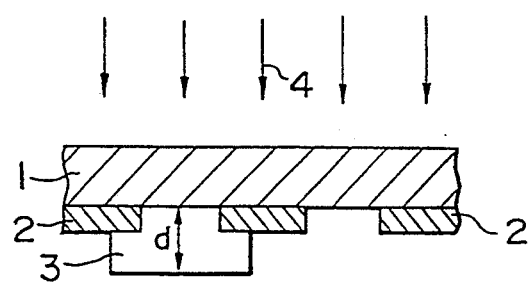
FIG. 5(A) is a sectional view of a prior art phase shifting mask.
FIG. 5(B) is a diagram showing the amplitude of light on a mask when a prior art phase shifting mask is used.
FIG. 5(C) is a diagram showing the amplitude of light on a wafer when a prior art phase shifting mask is used.
FIG. 5(D) is a diagram showing light intensity on a wafer when a prior art phase shifting mask is used.
Figure 5:
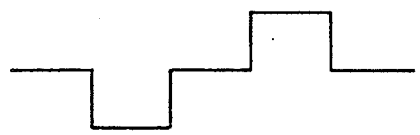
Figure 5:
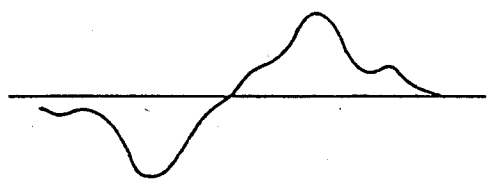
Figure 5:
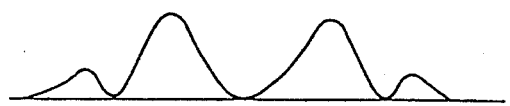
Figure 6:
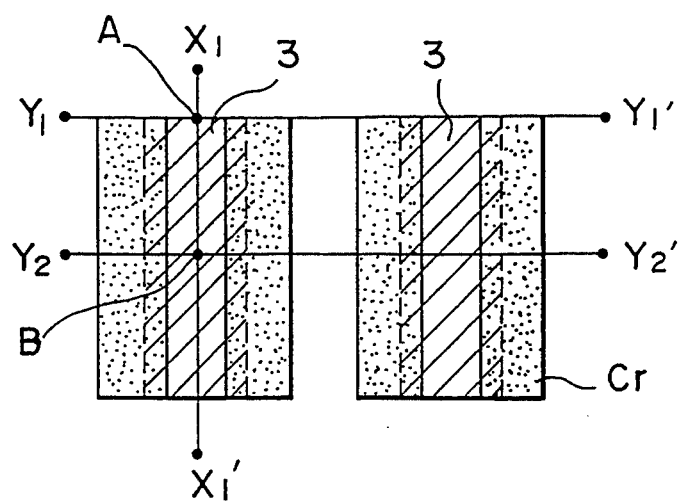
FIG. 6 is a top plan view of a prior art phase shifting mask.
Figure 7:
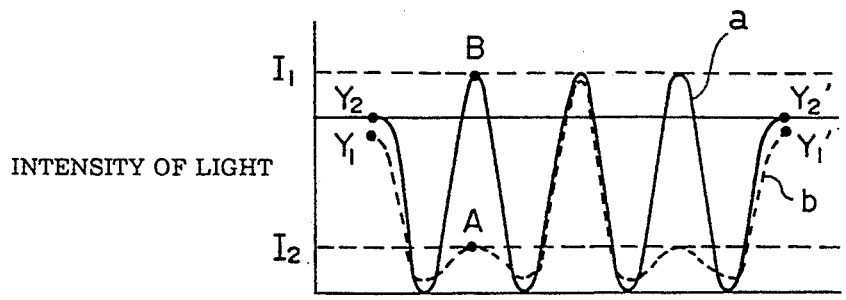
FIG. 7(A) is a diagram showing the distribution of light intensity on a wafer when a prior art phase shifting mask is used.
FIG. 7(B) is a diagram showing the distribution of light intensity on a wafer when a prior art phase shifting mask is used.
Figure 7:
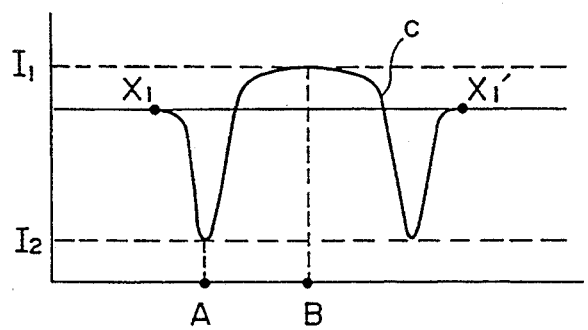

FIG. 4 is a view for evaluation of a resist pattern when the phase shifting mask is used. As is obvious from FIG. 4, the components of the resist pattern are clearly separated, which proves that the resolution is improved.

In the present invention, the phase difference between the two kinds of phase shifting layers is held at 180°×n (n=1, 3, 5, . . . ) by the following means.

Concretely, the thickness of the phase shifting layers 13a of 90° in phase is on the order of 2400 Å and that of the phase shifting layers 13b of 270° in phase is on the order of 7200 Å when they are formed of $MgF_2$ having a refractive index of 1.38 for i-rays of 365 nm in wavelength.

It is also possible that the phase shifting layers 13a of 90° in phase are formed of $MgF_2$ on the order of 2400 Å in thickness and the phase shifting layers 13b of 270° in phase are formed of (SiC) having a refractive index of 2.83 on the order of 1500 Å in thickness.

As is apparent from the foregoing description, the phase shifting mask of the present invention fabricated by forming the two kinds of phase shifting layers having a phase difference on the transparent base plate inverts relatively the phase of light projected on the phase shifting layers to improve resolution. Furthermore, since the two kinds of phase shifting layers are 90° in phase relative to the base plate, the reduction of light intensity in the shifter edge portion is suppressed and shifter edge transfer is suppressed. Accordingly, a phase shifting method according to the present invention is applicable to a process using a positive resist and to a process using a pattern other than patterns in which transmission sections are closed.

CAPABILITY OF EXPLOITATION IN INDUSTRY

The present invention arranges two kinds of phase shifting layers differing from each other in phase arranged alternately between adjacent shading sections and thereby the phases of light projected on the phase shading mask are inverted relatively to one another. Accordingly, resolution is a photolithographic process is improved.

We claim:
1. A phase shifting mask comprising:
   a transparent base member having a surface;
   shading layers capable of intercepting light, formed selectively on the surface of the base member; and
   first and second phase shifting layers formed alternately on the surface of the base member between the adjacent shading patterns to create a phase difference between light transmitted therethrough,
   wherein the phase difference between light transmitted through the first phase shifting layers and light transmitted through the base member is approximately on odd multiple of 90°, the phase difference between light transmitted through the second phase shifting layers and light transmitted through the base member is approximately 90° added to a multiple of 180°, and the phase difference between light transmitted through the first phase shifting layers and light transmitted through the second phase shifting layers is approximately an odd multiple of 180°.

2. A phase shifting mask according to claim 1, wherein said transparent base member comprises glass.

3. A phase shifting mask according to claim 1, wherein said first and second phase shifting layers comprise magnesium fluoride.

4. A phase shifting mask according to claim 3, wherein said first phase shifting layer has a thickness of 2400 Å and said second phase shifting layer has a thickness of 7200 Å when the light passing through the phase shifting mask has i-rays of about 365 nm in wavelength.

5. A phase shifting mask according to claim 1, wherein said first and second phase shifting layers comprise silicon dioxide.

6. A phase shifting mask according to claim 1, wherein said shading layers comprise chromium.

7. A phase shifting mask according to claim 1, wherein said shading layers comprise chromium dioxide.

8. A phase shifting mask comprising:
   a transparent base member having a surface;
   shading layers capable of intercepting light formed selectively on the surface of the base member; and
   first and second phase shifting layers formed alternately on the surface of the base member between adjacent shading patterns to create a phase difference between light transmitted therethrough,
   wherein the phase difference between light transmitted through the first phase shifting layers and light transmitted through the second phase shifting layer is approximately an odd multiple of 180°, the phase difference between light transmitted through the first phase shifting layers and light transmitted through the base member is not a multiple of 180°, and the phase difference between the light transmitted through the second phase shifting layers and light transmitted through the base member is not a multiple of 180°.

9. A phase shifting mask according to claim 8, wherein said transparent base member comprises glass.

10. A phase shifting mask according to claim 8, wherein said first and second phase shifting layers comprise magnesium fluoride.

11. A phase shifting mask according to claim 10, wherein said first phase shifting layer has a thickness of 2400 Å and said second phase shifting layer has a thickness of 7200 Å, the light passing through the phase shifting mask having i-rays of about 365 nm in wavelength.

12. A phase shifting mask according to claim 8, wherein said first and second phase shifting layers comprise silicon dioxide.

13. A phase shifting mask according to claim 8, wherein said shading layers comprise chromium.

14. A phase shifting mask according to claim 8, wherein said shading layers comprise chromium dioxide.

* * * * *